Dec. 26, 1967 E. R. KRETZMER 3,360,745

KEYED OSCILLATOR CIRCUIT

Filed Jan. 22, 1965

INVENTOR
E. R. KRETZMER
BY J. P. Kearns
ATTORNEY

1

3,360,745
KEYED OSCILLATOR CIRCUIT
Ernest R. Kretzmer, Holmdel, N.J., assignor to Bell Telephone Laboratories, Incorporated, New York, N.Y., a corporation of New York
Filed Jan. 22, 1965, Ser. No. 427,363
9 Claims. (Cl. 332—12)

ABSTRACT OF THE DISCLOSURE

A keyed transistor oscillator in which a back-to-back diode gate is selectively switched by a constant current from a driving transistor to alternatively connect a tank circuit, including an autotransformer, in the transistor oscillator to provide keyed oscillations. A resistance is connected between the center tap of the autotransformer and the diode gate to control the rise time of the keyed oscillations. A resistance is connected across the diode gate to control the fall time of the oscillations.

Figure 1:
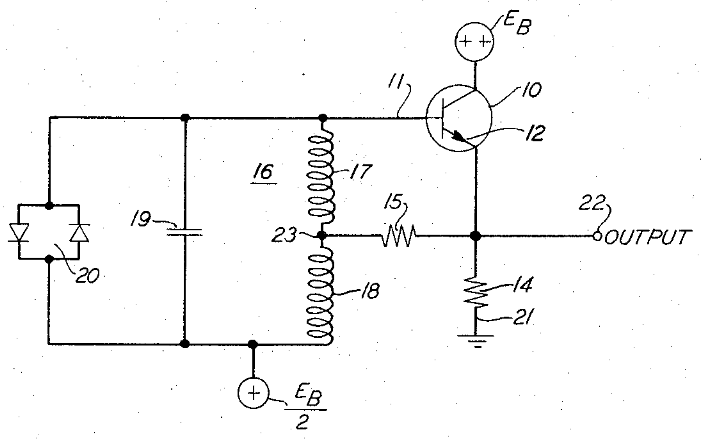
FIG. 1 PRIOR ART

This invention relates to keyed oscillators for generating on-off amplitude-modulation signals and particularly to such oscillators with dynamically controlled buildup and decay times, as well as controlled steady-state operation.

The well-known Hartley oscillator or its dual, the Colpitts oscillator, is capable of providing a clean sinusoidal signal wave in the steady-state condition. Either of these oscillators includes a tapped tank circuit in the grid-cathode circuit of an electron tube amplifier or the equivalent base-emitter circuit of a transistor amplifier. A feedback circuit thus exists between the common electrode, i.e., cathode or emitter, and the control electrode, i.e., grid or base, of the amplifying device. The resistance in this feedback path can be optimally adjusted for minimum harmonic distortion in the steady-state condition with a loop gain slightly exceeding unity. When the Hartley oscillator is keyed on and off, however, by applying or removing power, for example, the buildup and decay times become inordinately long. The buildup and decay times may extend over many cycles of the natural frequency of the tank circuit. On the other hand, if the tank circuit is shocked into oscillation, there results an instantaneous buildup, which is undesirable in some applications, where, for example, crosstalk between adjacent cable pairs or between frequency-multiplexed channels cannot be tolerated. Control of transient conditions tailors the signal spectrum to the frequency bounds of band-limited channels.

It is accordingly an object of this invention to provide a simple circuit for on-off keying of an oscillator of the Hartley or Colpitts type.

It is another object of this invention to permit a free choice of both buildup and decay times in a keyed Hartley or Colpitts oscillator.

It is a further object of this invention to permit independent control of buildup and decay times in a keyed oscillator of the Hartley type, while maintaining harmonic distortion at desirably low levels.

According to this invention, the feedback path between common and control electrodes through the tuned tank circuit of an oscillator of the Hartley or Colpitts type is modified by including a pair of back-to-back diodes therein. An external switch accomplishes the keying function by forward or reverse biasing these diodes. Since the diodes exhibit current-dependent resistance characteristics the loop gain is dynamically controlled by the interaction of the direct-current bias and the alternating-current oscillations during the buildup and decay periods as well as in the steady-state condition. An exact buildup

2 period is determinable by the choice of bias current applied to the diodes as well as by a choice of resistance in series with the diodes. An exact decay period is substantially determinable by the choice of a resistance shunting the diodes. An auxiliary switching device, such as a transistor and a constant-current biasing source, suffices for keying control. The buildup and decay rates are largely independent of transistor parameters and power supply fluctuations.

A feature of this invention is that the diodes perform a limiting function to maintain oscillations within prescribed bounds substantially without distortion. At the same time the amplifying device is held within its linear region of operation.

Another feature of the invention is that only two active elements are required; one, to maintain oscillation, and the other, to perform the keying function.

A further feature is that the diodes in the feedback path perform the dual functions of dynamic and static control of the loop gain of the oscillator.

Figure 2:
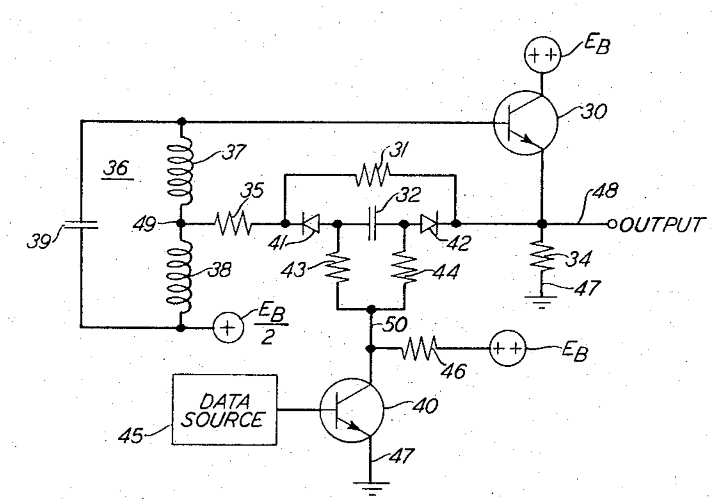

The above and other objects, features and advantages of this invention will be appreciated from a consideration of the following detailed description and the drawing in which:

FIG. 1 is a schematic diagram of a Hartley oscillator of the prior art with diode limiters shunted across the tank circuit; and FIG. 2 is a schematic diagram of a Hartley oscillator modified for on-off keying control according to this invention.

Referring now to FIG. 1, one sees a transistorized Hartley oscillator including amplifier junction transistor 10, tank circuit 16 and feedback resistor 15. Transistor 10, shown as the n-p-n type, includes the usual base electrode 11, emitter electrode 12 and collector electrode 13. Collector electrode 13 is biased by supply source $E_B$, indicated symbolically by an encircled double plus sign. Emitter electrode 12 is grounded through resistor 14 to ground reference 21, the negative side of the bias source (not shown). Base electrode 11 is connected directly to the upper end of tank circuit 16, i.e., at the junction of capacitor 19 and inductance coil 17. The lower end of tank circuit 16, at the junction of capacitor 19 and coil 18 is connected to a midtap on the bias source (not shown) indicated symbolically as $E_B/2$ by a single encircled plus sign. Feedback resistor 15 connects the junction 23 of coils 17 and 18 to emitter electrode 12. An output signal can be obtained through an inductive coupling to one of the coils 17 and 18 or directly across emitter resistor 14 as shown at terminal 22.

A p-n-p transistor can be substituted for transistor 10 as is well known, if the polarity of the bias source is reversed.

A Colpitts oscillator is of the same general structure as the Hartley oscillator except that the inductance coil and capacitor are interchanged. In this case the coil of the tank circuit is untapped and the capacitive branch is formed of two capacitors in series and the feedback connection is made to the junction of the two capacitors.

Either the Hartley or the Colpitts oscillator can be described as an emitter follower with positive feedback through the tank circuit from emitter electrode to base electrode. Since the emitter follower inherently has a gain less than unity, the loop amplification is made to exceed unity by autotransformer action, in the case of the Hartley oscillator, usually with a two-to-one voltage step-up ratio from emitter to base. If each coil section 17 or 18 has the same inductance, the voltage across the two coils in series will be twice that across lower coil section 18.

Resistor 15 is used to reduce the over-all loop gain from emitter to base to a point where harmonic distortion is acceptable for a particular application. Distortion, of course, depends also on the limiting mechanism. In the circuit of FIG. 1, silicon diodes 21 are connected in polarity opposition across tank circuit 16. These diodes have a fixed threshold level of conduction of about 0.6 volt under forward bias conditions and thus limit the maximum excursions of an oscillatory wave across the tank circuit in a symmetrical manner.

FIG. 1 represents the conventional Hartley oscillator in the steady-state condition. To ensure that harmonic distortion is held at least 50 decibels below the power of the fundamental frequency component, feedback resistor 15 ($R_f$) must be chosen to make the quiescent or initial loop gain ($A_L$) just slightly above unity. The gain of an emitter follower is generally close to unity and the remainder of the loop gain from autotransformer action equals $a \cdot R_o/(R_f+a^2R_o)$; where $a$ equals the ratio of the number of turns on coil 18 to the number of turns on coils 17 and 18 together and $R_o$ equals the equivalent parallel resistance across tank circuit 16 at resonance. Therefore, resistance $R_f$ must be slightly smaller than $a \cdot R_o(1-a)$.

When resistor 15 ($R_f$) is so chosen, however, the exponential buildup time becomes very long in the transient turn-on condition. The buildup time constant is equal to $2R_oC/(A_L-1)$, where C is the capacitance of capacitor 19. In terms of the Q (ratio of resistance at resonance to coil reactance in a parallel LC circuit, a quality factor) of the tank circuit, the buildup time constant equals $$(Q/\pi f_o)/(A_L-1).$$

Relating these expressions to the number of cycles for buildup, the buildup time can be shown to be directly proportional to Q and inversely proportional to the excess of the loop gain over unity. For example, for a Q of $10\pi$ and a loop gain $A_L$ of 1.10, the number of cycles for buildup is 100. To achieve a straightforward lowering of cycles for buildup there is required either a reduction in Q or an increase in loop gain. A change in either of these factors, however, increases distortion, and is therefore undesirable.

Considering decay time at turn-off, one might shunt the tank circuit with a resistor such that the resistance ($R_o$) of the tank circuit at resonance is diminished by a factor $m$ (less than unity). We then have an altered quality factor Q' equal to $m$Q and an altered loop gain $A_L'$ equal to $m'A_L$, where $$m' = m\frac{R_f+a^2R_o}{R_f+ma^2R_o}$$

The resulting decay time constant, in terms of number of cycles involved, equals $(mQ/\pi)/(1-m'A_L)$: For example, using the same values for Q, $a$ and $A_L$ as before and assuming reasonable values for $R_o$ of 4000 ohms, $R_f$ of 900 ohms, and $m$ of 0.5, $m'$ becomes 0.68 and the number of cycles for decay equals 33.

Because of the conflict between low distortion and reasonable buildup time, the tank circuit must be shocked into oscillation, according to present practices, to achieve both objectives simultaneously. The resultant instantaneous buildup may be undesirable in applications where, for example, multiplexed signaling channels are involved. It is the object of this invention to provide an improvement in keyed oscillator circuits which will permit a free and independent choice of both buildup and decay time constants.

FIG. 2 is a schematic diagram of the improved Hartley oscillator of this invention in which the loop gain is dynamically controlled at all times including both buildup and decay times. The improved oscillator includes amplifier junction transistor 30, tank circuit 36 and a feedback connection modified according to this invention between emitter and base electrodes of transistor 30. The collector electrode is biased positively by supply source $E_B$. The emitter electrode is grounded at reference 47 (negative side of bias source $E_B$) through resistor 34. The base electrode is connected directly to the upper end of tank circuit 36, i.e., at the junction of capacitor 39 and inductance coil 37. The lower end of tank circuit 36, at the junction of capacitor 39 and inductance coil 38, is connected to a midtap on the bias source (not shown) indicated symbolically by $E_B/2$. The feetback circuit connecting the junction 29 of coils 37 and 38 to the emitter electrode of transistor 30 is discussed in detail hereinafter. An output signal can be obtained through inductive coupling to one of the coils 37 or 38 or directly across emitter resistor 34 as shown at terminal 48.

The feedback path, represented by resistor 15 in FIG. 1, is replaced by a capacitor-coupled diode gate comprising capacitor 32 and oppositely poled diodes 41 and 42. Resistor 31, shunting the gate, and resistor 35, in series therewith, may be assumed for the moment to be respectively an open circuit and a short circuit. Blocking capacitor 32, of negligible reactance at the resonance frequency of the tank circuit, is used to avoid any need for using diode pairs with matched voltage drops.

Current for gating diodes 41 and 42 is supplied from the same bias source used as a collector supply through resistor 46. An essentially constant-current source is thus provided. This current source is connected to the anodes of diode 41 and 42 through respective resistors 43 and 44 under the control of switching transistor 40. The use of resistors 43 and 44 effectively splits the constant current into two equal fixed parts so that each diode is biased by the same amount of current.

Keying transistor 40 is shown as an n-p-n type with emitter grounded at reference point 47 (negative side of bias source $E_B$). The collector electrode of transistor 40 is connected to the common junction 50 of resistors 43, 44 and 46. The base electrode is biased by the output of data source 45. Source 45 delivers positive and negative outputs according to the bits in a binary data message. Transistor 40, when in saturation, grounds the current source and reverse biases diodes 41 and 42. The feedback path is thus opened and no oscillations can occur. On the other hand, when transistor 40 is cut off, current flows initially into diodes 41 and 42 in the forward direction.

The operation of the improved circuit may be explained in the following manner. Initially, keying transistor is in saturation responsive to a positive voltage level at data source 45, representing a spacing bit. The junction 50 of resistors 43, 44 and 46 is thus grounded. Both diodes 41 and 42 are back-biased and the feedback path is open. The oscillator is inoperative.

Assume that the constant-current source including resistor 46 in series with potential $E_{BB}$ is capable of providing a current $2I_D$. When the output of data source 45 becomes negative to represent a marking bit, transistor 40 is cut off. Current $2I_D$ is now split into two equal parts $I_D$ in resistors 43 and 44. Each of diodes 41 and 42 has an equal current $I_D$ flowing through it and each is therefore forward biased. The resistance of each is approximately $0.03/I_D$ over the range of interest. This value of resistance determines the maximum quiescent-point loop gain for the oscillator, which begins to oscillate. Capacitor 32 is essentially a short circuit at the frequency of tank circuit 36.

As oscillations increase, the total diode resistance also increases because the alternating-current due to the oscillations is alternately subtracted from the bias current in one diode and added to the bias current in the other diode. The resistance of the diode carrying diminished current, however, increases by a larger amount than the resistance of the diode carrying increased current. The total diode resistance thus increases to cause a decrease in loop gain with each expanding cycle. The buildup rate is effectively damped in accordance with the diode resistance characteristic.

This effect can readily be appreciated from an examination of the following equation for the total diode resistance as a function of the oscillatory current $i$.

$$r(i)=\frac{0.03}{I_D+i}+\frac{0.03}{I_D-i}=\frac{0.06I_D}{I_D^2-i^2}$$

Since $I_D$ is a constant, increasing $i$ results in a smaller denominator and hence a larger total resistance. Accordingly, the resistance value averaged over each cycle becomes larger. Loop gain is inversely proportional to the resistance in the feedback path and hence its average value approaches one, allowing the amplitude to stabilize. The buildup is therefore complete when the average diode resistance over a cycle is such as to make the average loop gain equal to unity. The variation of the diode resistance over the cycle causes little, if any, distortion, since the variation is gradual.

Steady-state oscillations continue at this level as long as a marking potential is applied to keying transistor 40. The loop gain reaches its maximum as the oscillatory wave goes through zero. Furthermore, since diodes 41 and 42 conduct the oscillatory current bilaterally, the loop gain reaches its minimum value at each positive and negative peak. The dynamic control effect of the diodes extends through the buildup period and throughout the steady-state period.

The loop gain variation over the cycle can be reduced by shunting diodes 41 and 42 with resistor 31, or, alternatively, by adding resistor 35 in series with the diodes. Additional control over buildup time and harmonic generation is thereby given. The value of resistor 31, however, has a more significant effect in controlling decay time.

When a positive potential from data source 45, representing a spacing bit, reaches its base, keying transistor 40 becomes saturated and the constant-current source is shorted to ground 47. Diodes 41 and 42 become back biased and the feedback loop is opened. Oscillations are damped out in accordance with the time constant of tank circuit 36, in the absence of any resistor 31. If a resistor 31 is inserted in shunt of diodes 41 and 42, then the damping is slowed down inasmuch as the loop gain now exceeds zero (but is less than unity) and the decay time constant equals $Q\pi/f_0(1-A_L)$. The effect of resistor 31 on decay rate is more critical than on average loop gain. Therefore, the consideration of desired decay rate largely determines its selection.

The addition of resistor 35 in series with diodes 41 and 42 provides a fine control on initial loop gain and helps in linearizing the feedback resistance. It is not essential to circuit operation, however.

The differences in operation of the prior art circuit of FIG. 1, which employs diodes shunting the oscillatory tank circuit 16 and the dynamically controlled circuit of this invention shown in FIG. 2 may be analogized with a swinging pendulum or a child on a swing. The prior art circuit of FIG. 1 resembles a freely swinging pendulum with stops at either end of its swing to limit the maximum amplitudes. This may be jarring to the pendulum if the positions of the stops are not carefully set. Starting and stopping are entirely uncontrolled.

The dynamic control of this invention more closely resembles the situation of a child on a swing who is given a running push each time he passes the middle of the swing arc. This push persists with diminishing force throughout all or most of the cycle at the discretion of the pusher. No jarring restraint is applied to limit the amplitude of the swing at either end of the arc. Furthermore, gentle pushes control the start of the swings and gentle restraints stop the swings.

An actual circuit embodying the principles of this invention for producing a steady-state frequency of 387 cycles per second was constructed using the following circuit values:

| | | |
|---|---|---|
| Capacitor **32** | microfarads | 10 |
| Capacitor **39** | do | .064 |
| Inductor **37**, **38** | henries | 2.7 |

| | | |
|---|---|---|
| Resistor **31** | ohms | 470 |
| Resistor **34** | do | 1500 |
| Resistor **35** | do | 10 |
| Resistor **43** | do | 15,000 |
| Resistor **44** | do | 15,000 |
| Resistor **46** | do | 7500 |

Transistor 30, 40, Western Electric Type 16D.

Diode 41, 42, Western Electric Type 432A.

| | | |
|---|---|---|
| $E_B$ | volts | 18 |

This circuit was found to operate with buildup and decay times balanced at 10 full cycles. Both second and third harmonic distortion were found to be between 40 and 50 decibels below the fundamental. Buildup time and amplitude were essentially independent of transistor parameters. Inherently stable diode properties governed by fundamental physical laws were the determining factors. Keying interference was minimal so that bandpass filtering requirements at the output were minimized, thus meeting the needs of a frequency-multiplexed system.

While this invention has been described in connection with a specific illustrative embodiment, various modifications will occur to those skilled in the art within the spirit and scope of the appended claims.

What is claimed is:

1. A keying arrangement for an oscillator of the feedback type including a tapped resonant tank circuit and an amplifying device with input and output electrodes connected to opposite ends of said tank circuit and the common electrode connected to the tap on said resonant circuit through a feedback path comprising a pair of diodes each having a resistance characteristic inversely proportional to forward current, capacitive means connecting said diodes in series opposition in said feedback path, means for supplying a constant forward biasing current to each of said diodes at their junctions with said capacitive means, the interaction of said biasing current and oscillatory current through said feedback path causing a variation in diode resistance during each cycle of oscillatory current from a maximum value at the peaks thereof to a minimum determined by said bias current alone at the zero crossings thereof, a switching device for grounding said current supplying means to stop the operation of said oscillator, and a binary data source controlling said switching device according to the content of a binary message.

2. The keying arrangement according to claim 1 in which said amplifying device and said switching device are each three-region transistors.

3. The keying arrangement according to claim 1 in which said current-supplying means comprises a fixed potential source, a first resistor connected between said potential source and said switching device, and a second and a third resistor each having one end connected to said switching device and the other ends connected to the respective junctions of said capacitive means and said diodes.

4. The keying arrangement according to claim 1 and a resistor in series with said diodes and said capacitive means to adjust the minimum resistance of said feedback path as a control on buildup rate during on-keying of said oscillator.

5. The keying arrangement according to claim 1 in which a further resistor is shunted across the series combination of said diodes and said capacitive means to control the maximum resistance of said feedback path and hence the decay rate during off-keying of said oscillator.

6. In combination with a first transistor having base, emitter and collector electrodes, a tank circuit in circuit with said first transistor, said base electrode being connected to one side of said tank circuit, said collector electrode being connected to a potential source and the other side of said tank circuit therethrough, and said emitter electrode being connected to an intermediate tapping point on said tank circuit through a feedback path to effect a step-up in potential between said emitter and base electrodes, means for keying said tank circuit into oscillation at a controlled rate in accordance with a binary data signal comprising a pair of diodes connected back-to-back and in series in said feedback path, a capacitor intercoupling said diodes in said feedback path, a constant-current source, means connecting said constant-current source to the respective junctions of said capacitor and said diodes, a second transistor for switching said constant-current source between ground reference and said diodes thus effectively reverse and forward biasing said diodes to open and close said feedback path, and a binary data source determining the state of said switching transistor.

7. A keyed oscillator circuit comprising a first junction transistor having collector, emitter and base electrodes, a resonant tank circuit located in the emitter circuit of said transistor, said base electrode being connected to one side of said tank circuit, said collector electrode being connected to a power supply and thence to the opposite side of said tank circuit, and said emitter electrode being connected to an intermediate point on the inductor of said tank circuit whereby said inductor acts as an autotransformer to supply and increase potential to said base electrode sufficient for a limited amount of feedback, a diode pair connected in polarity opposition between said intermediate point and said emitter electrode to exercise a dynamic control on the amount of feedback between said emitter and base electrodes during buildup of oscillations and to limit the maximum amount of feedback during steady-state operation of said oscillator, a capacitor linking the anodes of said diode pair, a split constant-current source for supplying equal fixed direct currents in the forward direction to said diodes, the level of said fixed currents determining the maximum feedback between said emitter and base electrodes and the combination of said fixed currents and the oscillatory currents through said diodes determining the dynamic feedback therebetween, a second junction transistor having collector-emitter and base electrodes acting as a keying device, the emitter electrode of said second transistor being grounded, the collector electrode of said second transistor being connected to the point at which said constant-current source is split selectively to ground or not said constant-current source, and a binary data source connected to the base electrode of said second transistor to turn said second transistor on and off in accordance with a data message and hence to control the intervals of oscillation of said tank circuit.

8. The keyed oscillator according to claim 7 in which a resistor is shunted across the series combination of said diode pair and said capacitor to determine the minimum feedback between the emitter and base electrodes of said first transistor.

9. The keyed oscillator according to claim 7 in which a further resistor is inserted in series between the intermediate point on said tank circuit and the emitter electrode of said first transistor to linearize the dynamic feedback between the emitter and base electrodes of said first transistor and to provide additional control over initial feedback loop gain.

References Cited

UNITED STATES PATENTS

| | | | |
|---|---|---|---|
| 2,925,561 | 2/1960 | MacDonald | 332—26 |
| 2,925,563 | 2/1960 | Firestone | 332—26 |
| 2,962,669 | 11/1960 | Mahler | 332—9 |
| 3,178,645 | 4/1965 | Schops | 331—166 |
| 3,193,777 | 7/1965 | Carter et al. | 331—172 |

JOHN KOMINSKI, *Primary Examiner.*